US007539317B2

(12) United States Patent
Aiso et al.

(10) Patent No.: US 7,539,317 B2
(45) Date of Patent: May 26, 2009

(54) DRIVE APPARATUS FOR VOLUME CONTROL DEVICES

(75) Inventors: Masaru Aiso, Hamamatsu (JP); Akio Suyama, Hamamatsu (JP)

(73) Assignee: Yamaha Corporation, Hamamatsu-Shi (JP)

( * ) Notice: Subject to any disclaimer, the term of this patent is extended or adjusted under 35 U.S.C. 154(b) by 717 days.

(21) Appl. No.: 10/608,786

(22) Filed: Jun. 26, 2003

(65) Prior Publication Data

US 2004/0005067 A1 Jan. 8, 2004

(30) Foreign Application Priority Data

Jul. 2, 2002 (JP) ............................ 2002-192898

(51) Int. Cl.
*H03G 3/00* (2006.01)

(52) U.S. Cl. ...................................... 381/104; 381/119

(58) Field of Classification Search ................ 381/104, 381/107, 109, 119, 120, 102, 101, 98, 105, 381/108; 84/625, 660
See application file for complete search history.

(56) References Cited

U.S. PATENT DOCUMENTS 6,341,166 B1 * 1/2002 Basel ........................ 381/103
6,839,441 B1 * 1/2005 Powers et al. ............... 381/119

* cited by examiner

*Primary Examiner*—Vivian Chin
*Assistant Examiner*—Con P Tran
(74) *Attorney, Agent, or Firm*—Morrison & Foerster LLP

(57) ABSTRACT

A drive apparatus for volume control devices is provided for setting, promptly and exactly, the position of a control device such as a fader to its standard position. A first volume control device (127-1), an operation position thereof is operative automatically, is provided for controlling a first gain of an audio signal. A position control device (128-1) is provided correspondingly to the first volume control device. A second volume control device (124-1), an operation position thereof is operative automatically, is provided for controlling a second gain of the audio signal, so that a total gain applicable to the audio signal is determined by the operation positions of the first and second volume control devices. A controller is provided for setting, when the position control device is operated, the operation position of the first volume control device to a pre-specified standard position (0 dB), and for setting the operation position of the second volume control device to a position where a previous total gain before the position control device is operated is maintained.

2 Claims, 4 Drawing Sheets

DRIVE APPARATUS FOR VOLUME CONTROL DEVICES

BACKGROUND OF THE INVENTION

1. Technical Field of the Invention

The present invention relates to a drive apparatus for volume control devices typically for use in mixing system for mixing audio signals.

2. Related Art

On mixing systems utilized in concert or the like, a plurality of input channel audio signals are mixed so that required audio signal is finally produced. The gains of the input channel audio signals are to be adjusted in various stages before in mixing. More specifically, the audio signals just input to the mixing system undergo gain adjustment in header amplifiers in which volume control knobs are typically applied to the adjustment. Subsequently, the signals undergo frequency characteristics equalizing as needed, and come under gain controls in fader amplifiers. The gains applied to the signals in the fader amplifiers are set by input fader knobs provided for individual input channels.

In addition to the individual input faders, other common faders might be assigned to a plurality of input channels. The common fader is so called DCA fader, i.e., digital controlled amplifier or digital controlled attenuator fader, in digital mixer, and so-called VCA fader, i.e., voltage controlled amplifier or voltage controlled attenuator fader, in analog mixer. The gain set by the DCA fader is multiplied by the gains set by the individual input faders, respectively, so that the actual gains applied to the plurality of input channels are determined. The DCA fader technique is useful for picking up and volume control of sounds generated by large-scale instruments such as pianos and drums or by a part of orchestra.

The sounds from a piano and other large-scale instruments are generally picked up by means of a plurality of microphones, which are assigned to individual input channels with the aim of balance adjustment. Those input channels are further assigned to one DCA fader. Accordingly, the balance among the audio signals picked up by the microphones is adjustable by means of the individual input faders, while the volume of the entire instrument is adjustable via the DCA fader.

It is desirable that the input and DCA faders are adjusted to obtain preferable volume when they are operated to a pre-specified standard position, e.g., "0 dB." If the DCA faders are adjusted in this way, when an input channel is to fade in, the operating personnel is merely required to operate the fader to the standard position thereof. Subsequently, while monitoring the actual sound, the personnel can adjust the fader position precisely. The volume adjustment at the standard position is preferably completed in the rehearsal process. However, if someone wishes to keep a constant gain throughout moving a certain fader knob to its standard position, then troublesome operation is required, such as operating the volume control knobs at the header amplifiers or operating the other faders, simultaneously.

SUMMARY OF THE INVENTION

It is accordingly an object of the present invention to provide a technique for setting, promptly and exactly, the position of a control device such as a fader knob to its standard position.

In carrying out the invention in one preferred mode, there is provided a first volume control device (127-1), an operation position thereof is operative automatically for controlling a first gain of an audio signal. A position control device (128-1) is provided correspondingly to the first volume control device. A second volume control device (124-1), an operation position thereof is operative automatically, is provided for controlling a second gain of the audio signal, so that a total gain applicable to the audio signal is determined by the operation positions of the first and second volume control devices. A controller is provided for setting, when the position control device is operated, the operation position of the first volume control device to a pre-specified standard position (0 dB), and for setting the operation position of the second volume control device to a position where a previous total gain before the position control device is operated is maintained.

Accordingly, if the position control device is operated, then the operation position of the first volume control device is set to the pre-specified standard position, automatically, and the operation position of the second volume control device is set to a position where a previous total gain before the operation of the position control device is maintained. Consequently, setting of the position of the first volume control device can be executed, promptly and exactly.

DETAILED DESCRIPTION OF THE EMBODIMENTS

1. Construction of the Embodiment

Figure 1:
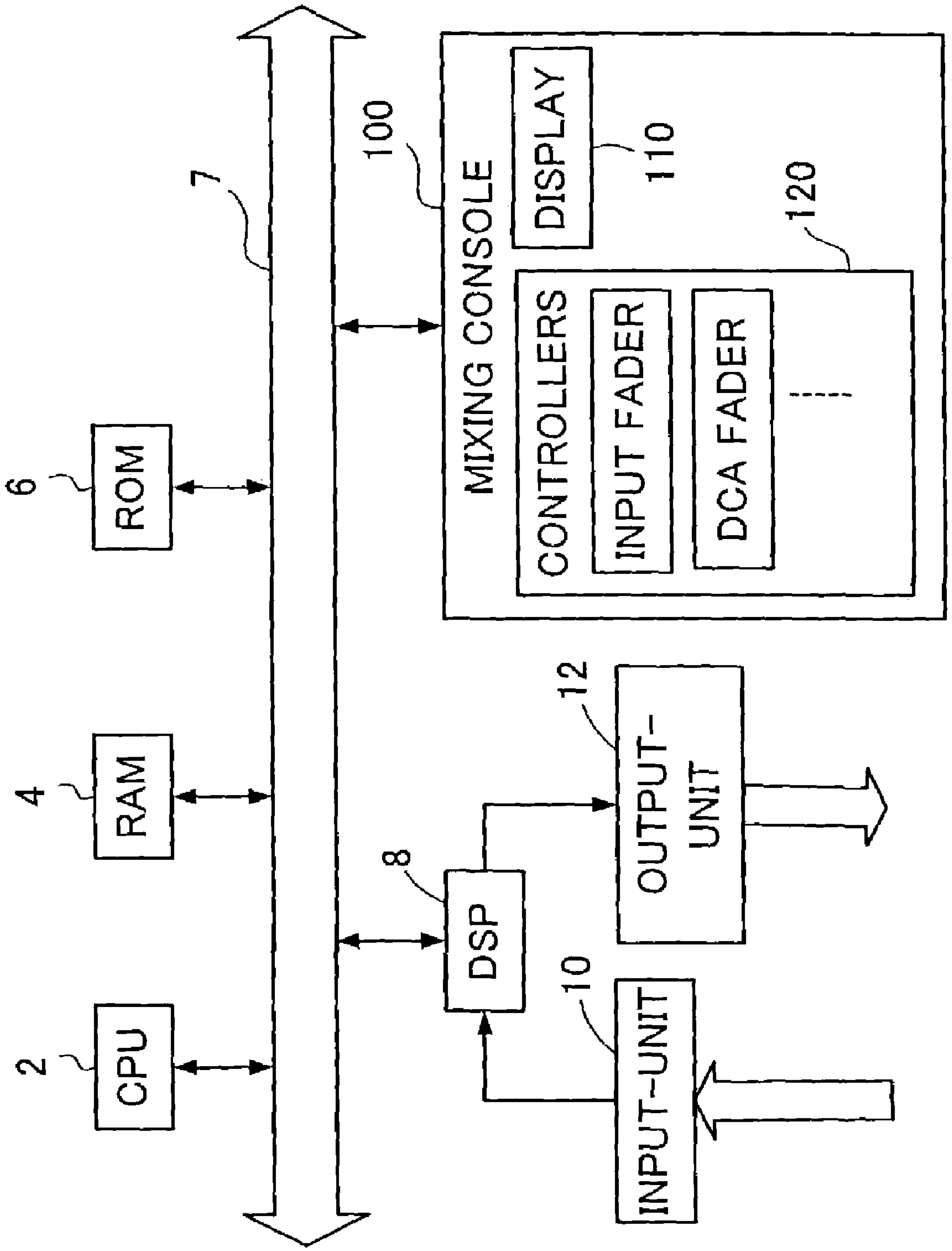
FIG. 1 is a hardware block diagram of a mixing system according to an embodiment of the present invention.

Referring now to FIG. 1, the following describes a hardware structure of a mixing system according to an embodiment of the present invention.

In FIG. 1, the symbol 2 denotes a CPU, which controls each section via a bus 7, in accordance with control programs stored in a ROM 6. The symbol 10 represents an input section that comprises AD converters for converting analog sound signals picked up by microphones, etc. into digital audio signals. The symbol 8 represents a DSP, which executes sound processing, such as mixing and equalizing, on the digital audio signals supplied form the input section 10. The mixing algorithm in DSP 8 is set by CPU 2. The symbol 12 represents an output unit, which converts digital audio signals from the DSP 8 into generative analog audio signals.

The symbol 100 represents a mixing console which comprises a control device section 120 consists of various control devices operational by the personnel, and a display 110 for showing various information to the personnel. The operational positions of the control devices in section 120 are measured digitally and transferred to CPU 2. Accordingly, the algorithm on the basis of the conditions of controls is set to the DSP 8 by means of the CPU 2. Furthermore, the controls can be driven automatically by means of motors and other actuators, so that the operational positions of the controls can be set automatically by commands from CPU 2.

Figure 2:
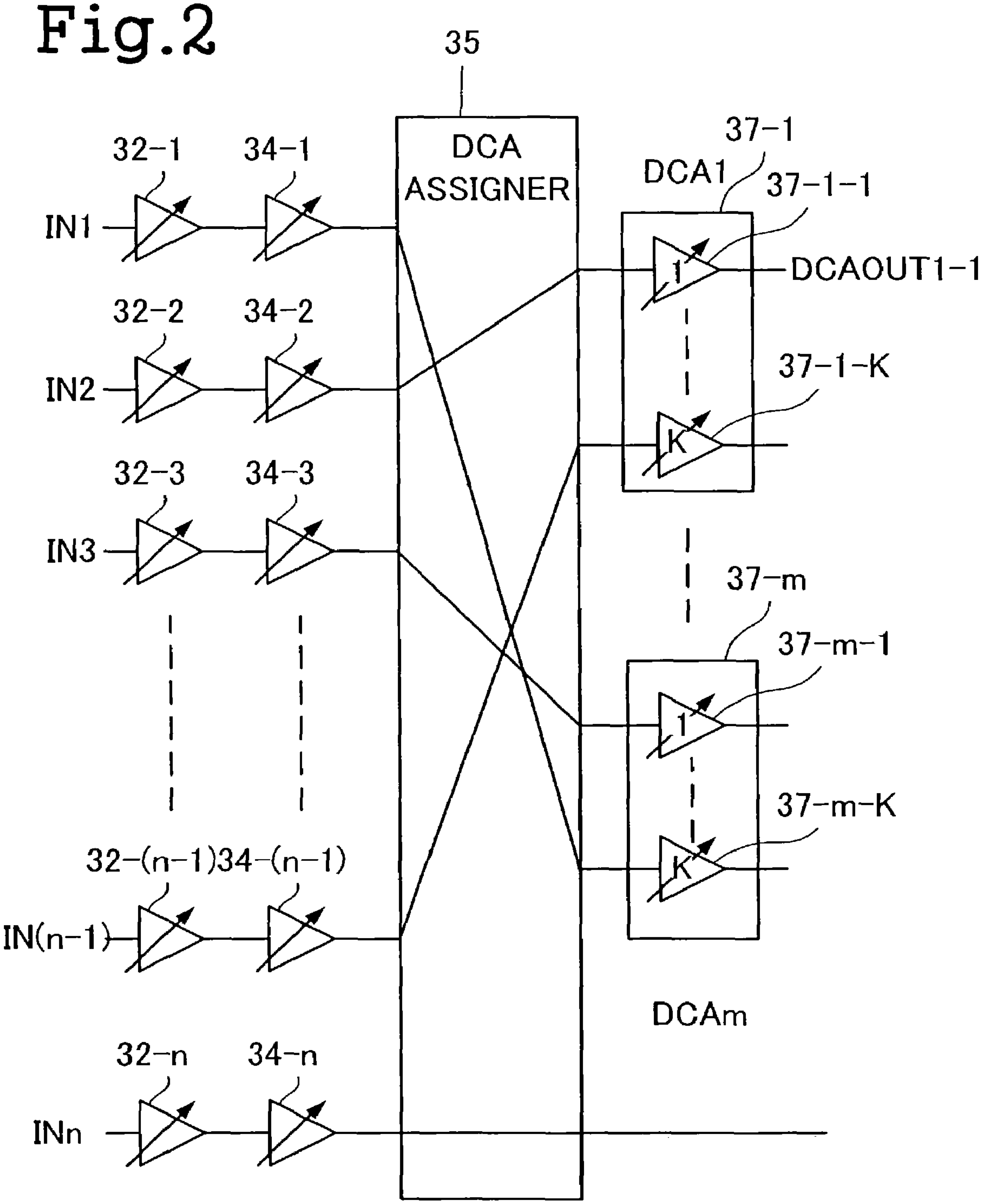
FIG. 2 is a block diagram of an algorithm of a substantial part of the mixing system according to the embodiment.

Referring now to FIG. 2, the following describes substantial part of the mixing algorithm executable in DSP 8. In FIG. 2, the symbols IN1 to INn represent input signals supplied to respective input channels via the input section 10. The symbols 32-1 to 32-n represent header amplifiers for amplifying the input signals IN1 to INn by designated gains, respectively. The symbols 34-1 to 34-n represent fader amplifiers for further executing gain adjustments for the input signals IN1 to INn which are gained previously in the header amplifiers 32-1 to 32-n.

Figure 3:
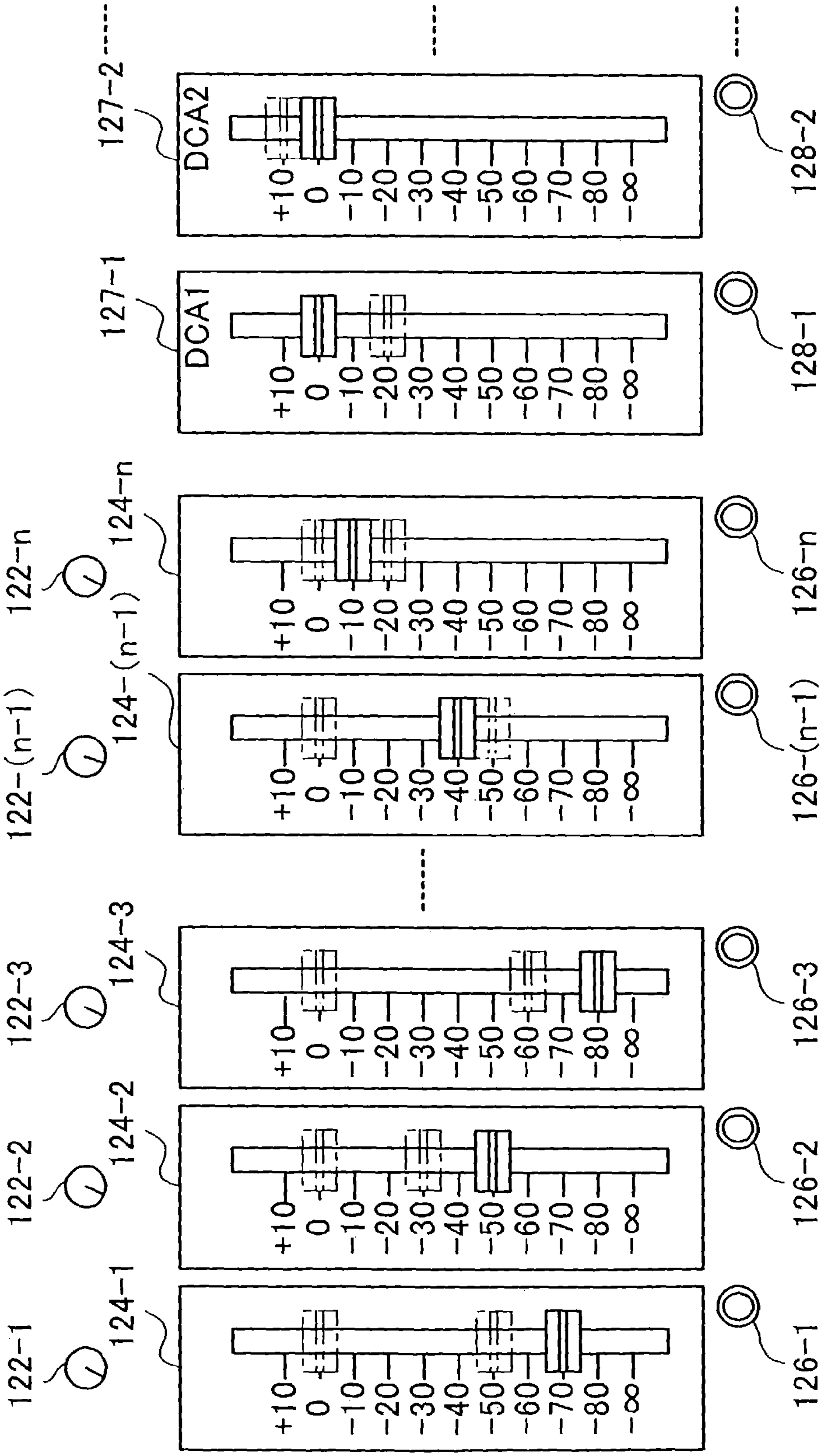
FIG. 3 is a plane view of a substantial part of a control device section 120.

The symbols 37-1 to 37-m represent "m" blocks of DCA gain adjusters. Each DCA gain adjuster 37-p (where "p" is any of 1 to k) comprises DCA amplifiers 37-p-1 to 37-p-k for amplifying maximum "k" channels of input signals by a common gain, respectively. The symbol 35 represents a DCA assigner for assigning audio signals generated by any of the fader amplifiers 34-1 to 34-n to arbitrary channels in the DCA gain blocks 37-1 to 37-m. Accordingly, the input channel audio signals which are not assigned to any DCA amplifier are undergo gain adjustments twice in all via a header amplifier and a fader amplifier, while the other input channel audio signals assigned to any DCA amplifier are undergo gain adjustments three times in all. The audio signals, the gains thereof are adjusted as just described, are then mixed in mixing buses (not shown) in the subsequent stage. FIG. 3 shows an outside view of the substantial part of the control device section 120. In FIG. 3, the symbols 122-1 to 122-n represent volume knobs, the operational positions thereof determine gains of the pertinent header amplifiers 32-1 to 32-n, respectively. The symbols 124-1 to 124-n represent fader knobs, the operational positions thereof determine gains of the pertinent fader amplifiers 34-1 to 34-n. The symbols 126-1 to 126-n represent nominal adjust switches for setting automatically the operational positions of the fader knobs 124-1 to 124-n to standard positions (i.e., 0 dB) thereof.

The symbols 127-1, 127-2, . . . represent DCA fader knobs, the operational positions thereof determine common gains in the pertinent DCA gain adjusters 37-1 to 37-m, respectively. The symbols 128-1, 128-2, . . . represent nominal adjust switches for setting automatically the operational positions of the pertinent fader knobs 124-1, 124-2, . . . to standard positions (i.e. "0 dB") thereof.

2. Operation of the Embodiment

Figure 4A:
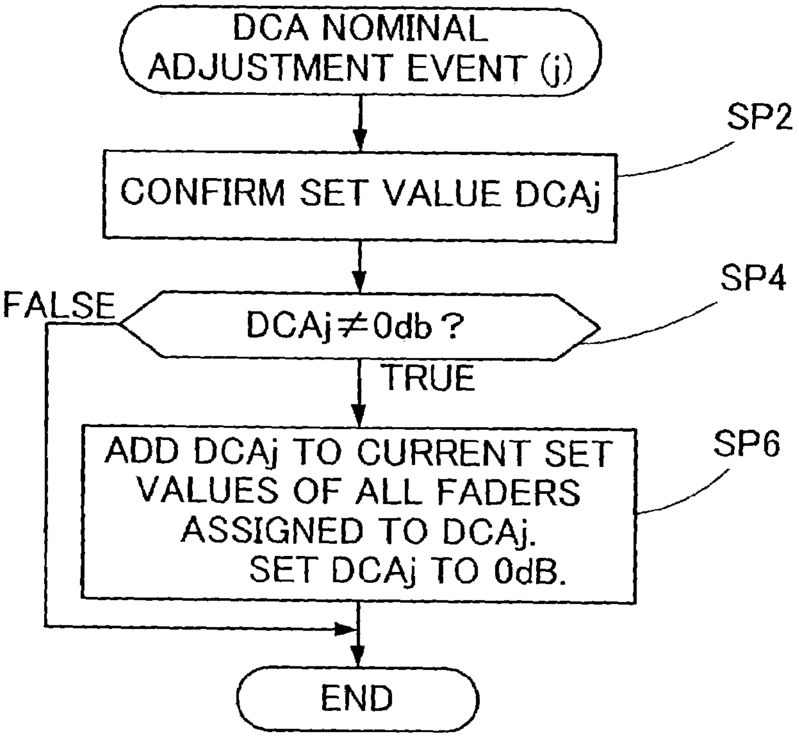
FIGS. 4A and 4B are flowcharts of control programs implemented in CPU 2.

The following describes the operation of the embodiment. When a "depress event" occurs at any nominal adjust switch 128-j (where "j" is any of 1 to m), an event processing routine shown in FIG. 4A is executed. In FIG. 4A, when the process proceeds to step SP2, a set value DCAj of the operational position of DCA fader knobs 127-j is fetched. When the process proceeds to step SP4, it is determined whether or not the set value DCAj is other than "0 dB". If the result is "FALSE", then this routine terminates without taking any practical actions.

Meanwhile, if the result in step SP4 is "TRUE", then the process proceeds to step SP6, wherein the fetched value DCAj is added to the current set values of all of the operational positions of fader knobs which are assigned to the DCA fader knobs 127-j. Furthermore, in step SP6, the operational position set value DCAj of the DCA fader knobs 127-j is changed to "0 dB". Then, the process of this routine terminates. Referring again to FIG. 3, the following describes operative example of this routine.

Let us suppose that the fader knobs 124-1 to 124-3 out of all fader knobs are assigned to the DCA fader knob 127-1, and knobs 124-(n−1) and 124-n are assigned to the DCA fader knob 127-2. In the supposal, the operational positions of the fader knobs 124-1 to 124-3 are "−50 dB", "−30 dB" and "−60 dB", which are indicated as lower alternate long and short dash line in FIG. 3, and the position of DCA fader knob 127-1 is "−20 dB" which is indicated by alternate long and short dash line.

If the nominal adjust switch 128-1 is depressed, then the value "−20 dB" is added to the set values of the operational positions of fader knobs 124-1 to 124-3, respectively, so that the set values thereof are changed to "−70 dB", "−50 dB" and "−80 dB", respectively. Furthermore, the set value of the operational position of DCA fader knob 127-1 is changed to "0 dB". Those positions are indicated by continuous line in FIG. 3. Then, the fader knobs are driven automatically so that the actual operational positions thereof may coincide with the pertinent set values.

Similarly, in the supposal, the operational positions of fader knobs 124-(n−1) and 124-n are "−50 dB" and "−20 dB", respectively, which are indicated as lower alternate long and short dash line in FIG. 3, and the position of DCA fader knob 127-2 is "+10 dB". If the switch 128-2 is depressed, then the value "+10 dB" is added to the set values of the operational position of the fader knobs 124-(n−1) and 124-n, so that the set values are changed to "−40 dB" and "−10 dB", respectively. Furthermore, the set value of the operational position of DCA fader knob 127-1 is changed to "0 dB", accordingly. Those positions are indicated by continuous line in FIG. 3. Then, the fader knobs are driven automatically so that the operational positions thereof may coincide with the pertinent set values.

Figure 4B:
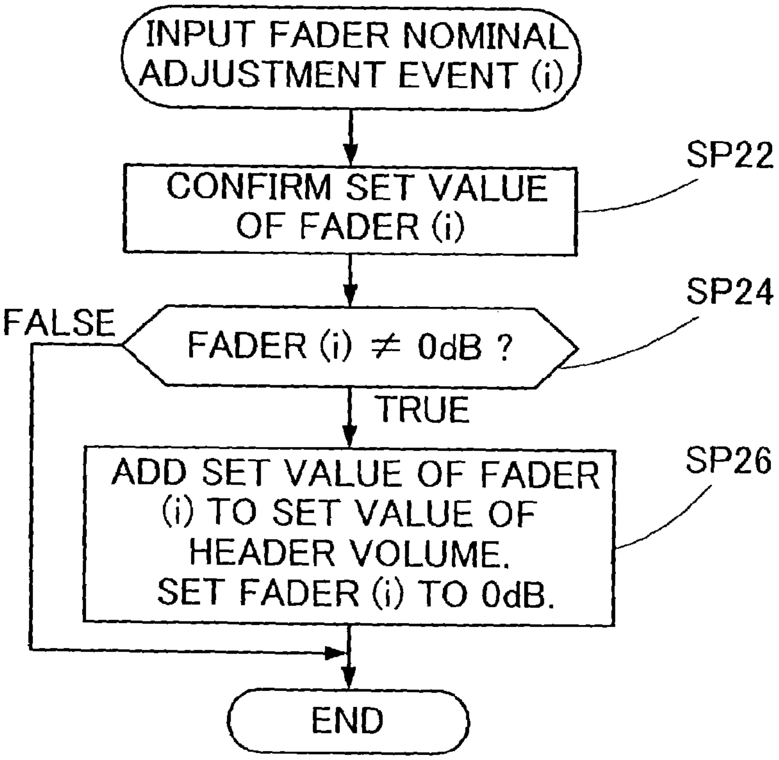

Next, when a depress event occurs at any nominal adjust switch 126-i (where i is 1 to n), another event processing routine shown in FIG. 4B is executed.

In FIG. 4B, when the process proceeds to step SP22, a set value INi of the operational position of fader knob 124-i is fetched. When the process proceeds to step SP24, it is determined whether or not the set value INi is other than "0 dB". If the result is "FALSE", this routine terminates without taking any practical actions.

Meanwhile, if the result in step SP24 is "TRUE", the process proceeds to step SP26, wherein the fetched value INi is added to the current set value of the operational positions of volume knob 122-i. Furthermore, in step SP26, the set value INi is changed to "0 dB". Then, the process of this routine terminates. Referring again to FIG. 3, the following describes operative example of this routine.

Let us suppose that the set value of the fader knob 124-1 is "−70 dB" (continuous line) and the set value of the volume knob 122-1 is "+40 dB". If the nominal adjust switch 126-1 is depressed, then the value "−70 dB" is added to the set value of the volume knob 122-1, so that the set value is changed to "−30 dB". Furthermore, the set value of the operational position of fader knob 124-1 is changed to "0 dB", accordingly. The position thereof is indicated as upper alternate long and short dash line in FIG. 3. Then, the volume knob 122-1 and fader knob 124-1 are driven automatically so that the operational position thereof may coincide with the pertinent set values.

The other nominal adjust switches 126-2 to 126-n operate in similar manner, so that the set values of the pertinent fader knobs are aligned at "0 dB" by depressing those switches. As described heretofore, according to the present embodiment, the personnel can set automatically the operational position of any fader knob to the standard position thereof, by merely depressing the pertinent nominal adjust switch.

3. Modifications

The invention may be embodied in other specific forms without departing from the spirit or essential characteristics thereof. The present embodiment is therefore to be considered in all respects as illustrative and not restrictive, the scope of the invention being indicated by the appended claims rather than by foregoing description and all changes which come within the meaning and range of equivalency of the claims are therefore intended to be embraced therein. For example, following modification may be made for the embodiment.

(1) In accordance with step SP6 in the foregoing embodiment, if the nominal adjust switch 128-j is depressed, then the set values of fader knobs 124-1 to 124-n, the pertinent input channels thereof assigned to the DCA fader knobs 127-j, are to be changed. Alternatively, in the step SP6, the set values of volume knobs 122-1 to 122-n can be changed in place of the fader knobs 124-1 to 124-n.

(2) Furthermore, according to the foregoing embodiment, the present invention is embodied as a digital mixer, in which the mixing algorithm is executed in the DSP 8, however, the present invention should not be restricted to the digital mixer. More specifically, the present invention can be applied to an analog mixer, in which the volume knobs and the fader knobs are fastened to respective variable resistors provided for adjusting directly the gains of audio signals, if the volume knobs and the fader knobs can be driven automatically.

CROSS REFERENCE TO RELATED APPLICATION

The basic foreign application filed on Jul. 2, 2002, No. 2002-192898 in Japan is hereby incorporated by reference.

What is claimed is:

1. A drive apparatus for volume control devices, comprising:

a first volume control device, an operation position thereof is driven automatically and operated manually for controlling a first gain of an audio signal;

a position control device provided correspondingly to the first volume control device;

a second volume control device, an operation position thereof is driven automatically and operated manually for controlling a second gain of the audio signal, so that a total gain applicable to the audio signal is determined by the operation positions of the first and second volume control devices;

a controller for automatically setting, when the position control device is operated, the operation position of the first volume control device to a pre-specified standard position, and for automatically setting the operation position of the second volume control device to a position where a previous total gain before the position control device is operated is maintained; and an assigner for assigning a plurality of audio signals corresponding to arbitrary ones of the second volume control devices to the first volume control device, wherein a plurality of the second volume control devices are provided corresponding to a plurality of audio signals assigned to a plurality of channels, respectively, and the controller is further characterized by setting the operation positions of the second volume control devices to respective positions where previous total gains before the position control device is operated are maintained.

2. The drive apparatus for volume control devices according to claim 1, wherein a plurality of the first volume control devices are provided corresponding to a plurality of audio signals groups, and a plurality of the position control devices are provided correspondingly to the first volume control devices, respectively.

* * * * *